(12) United States Patent
Hu et al.

(10) Patent No.: US 11,563,064 B2
(45) Date of Patent: Jan. 24, 2023

(54) ARRAY SUBSTRATE, DISPLAY DEVICE, AND METHOD FOR FABRICATING AN ARRAY SUBSTRATE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Youyuan Hu, Beijing (CN); Xinzhu Wang, Beijing (CN); Xinfeng Wu, Beijing (CN); Mengyu Luan, Beijing (CN); Fei Li, Beijing (CN); Huihui Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 837 days.

(21) Appl. No.: 16/339,083

(22) PCT Filed: Sep. 5, 2018

(86) PCT No.: PCT/CN2018/104146
§ 371 (c)(1),
(2) Date: Apr. 3, 2019

(87) PCT Pub. No.: WO2019/114332
PCT Pub. Date: Jun. 20, 2019

(65) Prior Publication Data
US 2021/0343805 A1    Nov. 4, 2021

(30) Foreign Application Priority Data
Dec. 14, 2017  (CN) .......................... 201711341714.9

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 27/3283* (2013.01); (Continued)

(58) Field of Classification Search
CPC ............. H01L 27/3246; H01L 27/3258; H01L 27/3283; H01L 51/5281; H01L 51/56; (Continued)

(56) References Cited

U.S. PATENT DOCUMENTS 7,777,406 B2 * 8/2010 Son ...................... H01L 51/5218
                                                              313/503
9,099,674 B2 * 8/2015 Ha ...................... H01L 51/5234
(Continued)

FOREIGN PATENT DOCUMENTS

CN    1773356 A    5/2006
CN    108091677 A   5/2018
(Continued)

OTHER PUBLICATIONS

PCT International Search Report, Application No. PCT/CN2018/104146, dated Nov. 27, 2018, 5 pages: with English translation.
(Continued)

*Primary Examiner* — S M Sohel Imtiaz
(74) *Attorney, Agent, or Firm* — Armstrong Teasdale LLP

(57) ABSTRACT

The present disclosure relates to an array substrate, a display device, and a method for fabricating an array substrate. The array substrate includes a pixel defining layer on the dielectric layer, the pixel defining layer defining a plurality of pixel regions of the array substrate, and light emitting device on the dielectric layer and in the plurality of pixel regions. The
(Continued)

device includes a first electrode, a light emitting layer, and a second electrode sequentially disposed from bottom to top. At least one of the plurality of pixel regions has a non-light emitting region adjacent to the pixel defining layer. The dielectric layer in the non-light emitting region has a groove. The array substrate further includes a light shielding portion located in the non-light emitting region and extending into the groove.

20 Claims, 9 Drawing Sheets

(52) U.S. Cl.
CPC .......... *H01L 51/5281* (2013.01); *H01L 51/56* (2013.01); *H01L 27/322* (2013.01); *H01L 2227/323* (2013.01)

(58) Field of Classification Search
CPC ............. H01L 27/322; H01L 2227/323; H01L 27/3213; H01L 51/5284; H01L 51/5262
See application file for complete search history.

(56) References Cited

U.S. PATENT DOCUMENTS

| 2008/0020500 | A1* | 1/2008 | Park | H01L 51/5284 |
| | | | | 257/E21.002 |
| 2016/0126225 | A1* | 5/2016 | Huang | H01L 27/156 |
| | | | | 257/91 |
| 2016/0313604 | A1* | 10/2016 | Yin | G02F 1/133371 |
| 2019/0088185 | A1* | 3/2019 | Zhang | G09G 3/2003 |
| 2020/0006702 | A1* | 1/2020 | Sonoda | H01L 27/3223 |

FOREIGN PATENT DOCUMENTS

| JP | 2009251486 A | * | 10/2009 |
| JP | 2009251486 A | | 10/2009 |

OTHER PUBLICATIONS

PCT Written Opinion, Application No. PCT/CN2018/104146, dated Nov. 27, 2018, 6 pages.: with English translation of relevant part.

* cited by examiner

ARRAY SUBSTRATE, DISPLAY DEVICE, AND METHOD FOR FABRICATING AN ARRAY SUBSTRATE

CROSS REFERENCE TO RELATED APPLICATIONS

This patent application is a National Stage Entry of PCT/CN2018/104146 filed on Sep. 5, 2018, which claims the benefit and priority of Chinese Patent Application No. 201711341714.9 filed on Dec. 14, 2017, the disclosures of which are incorporated by reference herein in their entirety as part of the present application.

BACKGROUND

The present disclosure relates to the field of display technology, and in particular, to an array substrate, a display device, and a method for fabricating an array substrate.

With the rapid advancement of display technology, the semiconductor technology as a core technology of the display device, has also made great progress. For existing display devices, organic light-emitting diodes (OLEDs), as a current-type light emitting device, are being used more and more in a field of high performance display due to its advantages of self-luminescence, fast response, wide viewing angle, and ability to be fabricated on flexible substrates.

BRIEF DESCRIPTION

Embodiments of the present disclosure provide an array substrate, a display device, and a method for fabricating an array substrate.

A first aspect of the present disclosure provides an array substrate. The array substrate includes a base substrate having a plurality of pixel regions, a light emitting device disposed in the plurality of pixel regions, wherein at least one of the plurality of pixel regions has a groove at a peripheral portion thereof and a light shielding portion located in the groove, wherein a height of a bottom surface of the groove in a direction perpendicular to a surface of the base substrate is lower than a height of the light emitting layer of the light emitting device in a direction perpendicular to the surface of the base substrate.

In an embodiment, the light emitting device includes a first electrode, a light emitting layer, and a second electrode sequentially disposed from bottom to top, wherein the second electrode has an extension portion extending into the groove, and the extension portion of the second electrode functions as the light shielding portion.

In an embodiment, wherein the light emitting layer and the second electrode are coextensive and cover the groove.

In an embodiment, a distance D between a bottom surface of the groove and a bottom surface of the first electrode in a direction perpendicular to the surface of the base substrate is in a range of $B<D\leq\sqrt{3}(A+B)$, wherein B is a thickness of the light emitting layer, and A is a distance between the plurality of pixel regions in a direction parallel to the surface of the base substrate.

In an embodiment, the groove is disposed in the base substrate.

In an embodiment, the array substrate further includes a dielectric layer between the light emitting device and the base substrate, and wherein the groove is disposed in the dielectric layer.

In an embodiment, the array substrate further includes a pixel defining layer between adjacent pixel regions, and wherein the light emitting layer and the second electrode further cover the pixel defining layer.

In an embodiment, the at least one pixel region includes a white sub-pixel region, and the plurality of pixel regions further includes a color sub-pixel region adjacent to the white sub-pixel region.

In an embodiment, the second electrode includes a reflective electrode.

In an embodiment, the light emitting layer is capable of emitting white light, wherein the color sub-pixel region further includes a color resist disposed between the base substrate and the dielectric layer.

A second aspect of the present disclosure provides a display device including the above-described array substrate.

A third aspect of the present disclosure provides a method for fabricating an array substrate. The method for fabricating an array substrate includes providing a base substrate having a plurality of pixel regions, forming a groove in a peripheral portion of at least one of the plurality of pixel regions, and forming a light emitting device on the base substrate and in the plurality of pixel regions, wherein a height of a bottom surface of the groove in a direction perpendicular to a surface of the base substrate is lower than a height of the light emitting layer of the light emitting device in a direction perpendicular to the surface of the base substrate. The method further includes forming a light shielding portion in the groove.

In an embodiment, forming the groove includes forming the groove into the base substrate.

In an embodiment, forming the light emitting device includes forming a first conductive layer on the base substrate, removing a portion of the first conductive layer between adjacent pixel regions and a portion of the first conductive layer in the groove of the at least one pixel region, wherein a remaining portion of the first conductive layer forms a first electrode of the light emitting device, forming a pixel defining layer on a portion of the base substrate between adjacent pixel regions, forming the light emitting layer on a surface of the first electrode, a surface of the groove, and a surface of the pixel defining layer, and forming a second electrode of the light emitting device on the light emitting layer, wherein a portion of the second electrode located in the groove forms the light shielding portion.

In an embodiment, forming the groove includes forming a dielectric layer on the base substrate, and forming the groove into the dielectric layer.

In an embodiment, forming the light emitting device includes forming a first conductive layer on the dielectric layer, removing a portion of the first conductive layer between adjacent pixel regions and a portion of the first conductive layer in the groove of the at least one pixel region, wherein a remaining portion of the first conductive layer forms a first electrode of the light emitting device, forming a pixel defining layer on a portion of the dielectric layer between adjacent pixel regions, forming the light emitting layer on a surface of the first electrode, a surface of the groove, and a surface of the pixel defining layer, and forming a second electrode of the light emitting device on the light emitting layer, wherein a portion of the second electrode located in the groove forms the light shielding portion.

In an embodiment, the second electrode includes a reflective electrode, and the plurality of pixel regions further include a color sub-pixel region adjacent to the white sub-pixel region, the method also includes, prior to forming the dielectric layer, forming, in the color sub-pixel region, a color resist between the base substrate and the dielectric layer, wherein the dielectric layer functions as a planarization layer.

BRIEF DESCRIPTION OF THE DRAWINGS

In order to more clearly illustrate the technical solutions of the embodiments of the present disclosure, the drawings of the embodiments will be briefly described below. It should be understood that the drawings described below relate only to some embodiments of the present disclosure, rather than to limit the disclosure. Wherein.

DETAILED DESCRIPTION

Figure 1A:
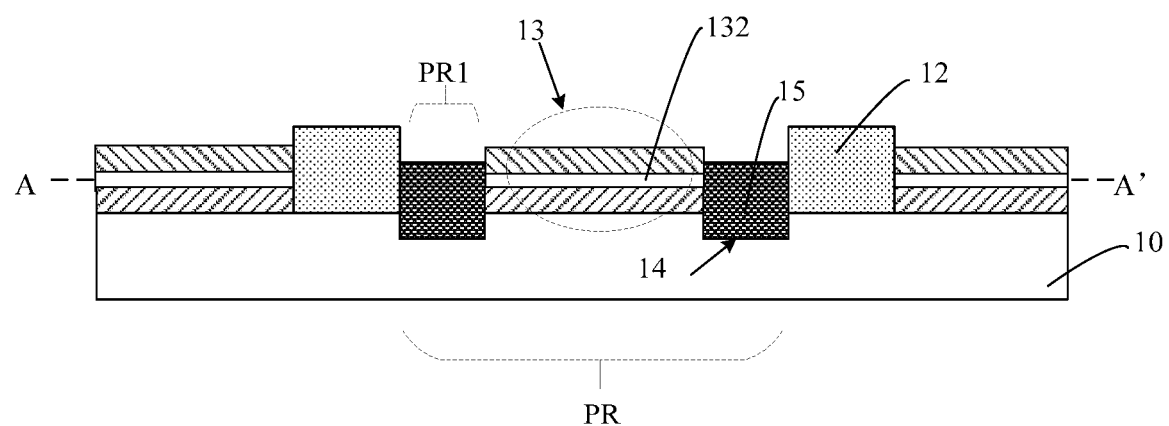
FIG. 1A is a schematic view of an array substrate according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating, or semiconductor layers at the interface of the two elements.

Figure 1B:
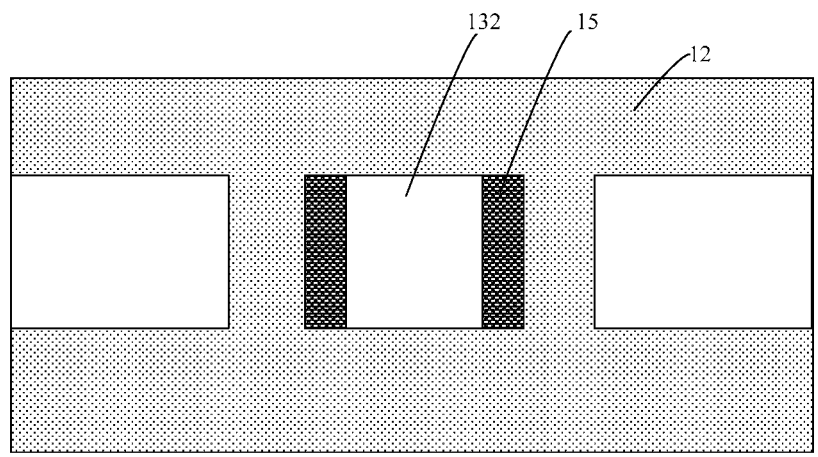
FIGS. 1B and 1C are schematic cross-sectional views of the array substrate of FIG. 1A taken along an AA' plane.
Figure 1C:
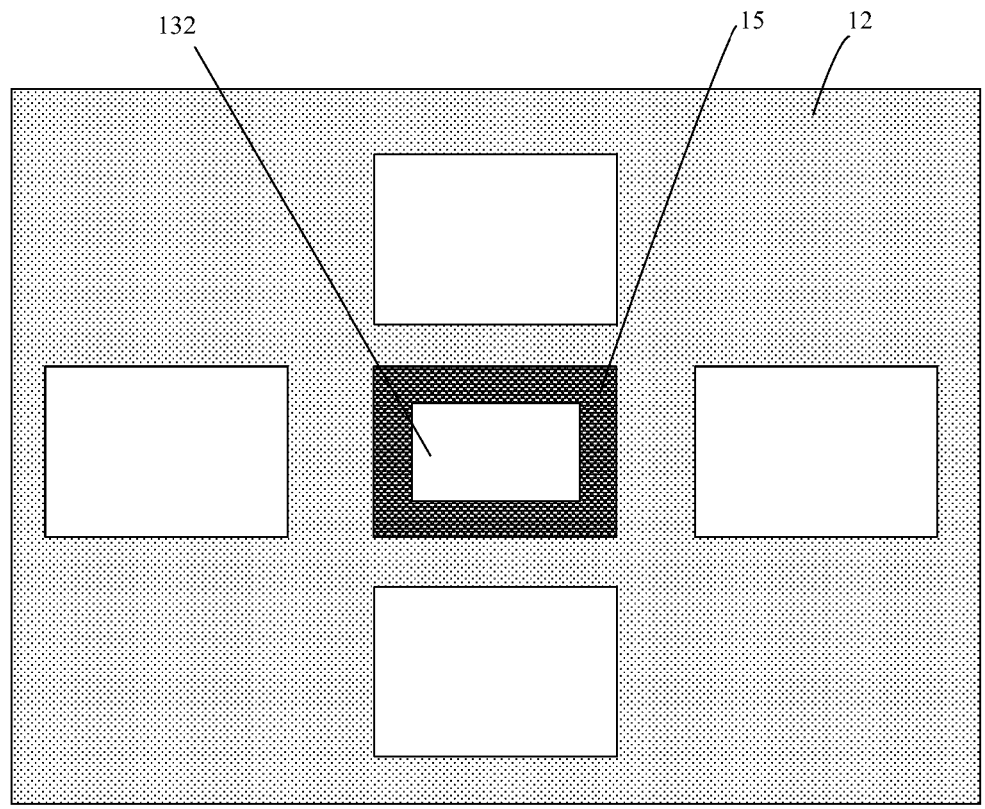

FIG. 1A is a schematic view of an array substrate according to an embodiment of the present disclosure. FIGS. 1B and 1C are schematic cross-sectional views of the array substrate of FIG. 1A taken along an AA' plane. As shown in FIG. 1A and FIG. 1B, an array substrate according to an embodiment of the present disclosure includes a base substrate 10, wherein the base substrate 10 has a plurality of pixel regions PR, and a light emitting device 13 disposed in the plurality of pixel regions, wherein at least one of the plurality of pixel regions has a groove 14 at a peripheral portion PR1 thereof and a light shielding portion 15 located in the groove 14. A height of a bottom surface of the groove 14 in a direction perpendicular to a surface of the base substrate 10 is lower than a height of the light emitting layer 132 of the light emitting device 13 in a direction perpendicular to the surface of the base substrate 10.

In the conventional OLED pixel structure, there is a problem of light leakage of lateral light leakage between adjacent two pixels. However, the embodiments of the present disclosure can solve the problem of the lateral light leakage by providing the light shielding portion with small influence on the aperture ratio. It should be noted that although FIG. 1A is exemplified by providing grooves on both sides of a pixel region, the number and position of the grooves may be set according to actual needs. For example, a groove may be provided at a plurality of pixel regions. For one pixel region, it is also possible to provide a groove only on one side thereof, or to provide a groove around the pixel region as shown in FIG. 1C.

As shown in FIG. 1A, the array substrate may further include a pixel defining layer 12 between adjacent pixel regions. The pixel defining layer may define a plurality of pixel regions of the array substrate. Hereinafter, the array substrate including the pixel defining layer will be described as an example.

Figure 2:
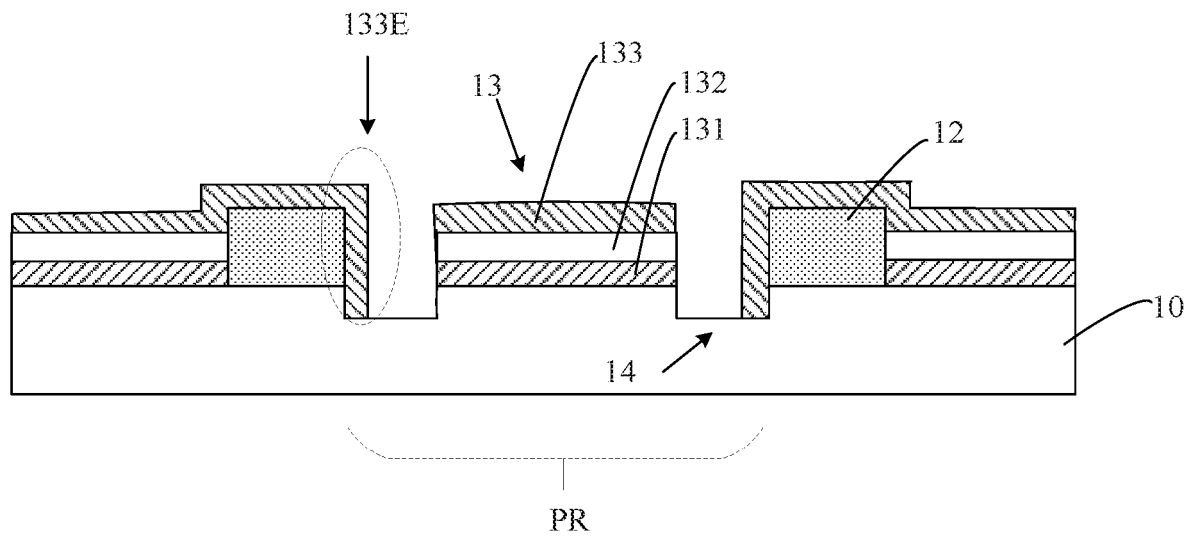
FIG. 2 is a schematic view of an array substrate according to an embodiment of the present disclosure.

FIG. 2 is a schematic view of an array substrate according to an embodiment of the present disclosure. As shown in FIG. 2, in an embodiment, the light emitting device 13 may include a first electrode 131, a light emitting layer 132, and a second electrode 133 sequentially disposed from bottom to top. The second electrode 133 has an extension portion 133E extending into the groove 14. The extension portion 133E functions as the light shielding portion. By using a part of the second electrode as the light shielding portion, lateral light shielding is realized, lateral light leakage between pixels is reduced, the influence on the aperture ratio is small, and the process is relatively simple.

According to some embodiments of the present disclosure, a groove may be formed in the base substrate 10 as shown in FIGS. 1A-1C and 2. However, in an embodiment, as shown in FIGS. 3 and 4, the array substrate may further include a dielectric layer 11 between the light emitting device and the base substrate, wherein the groove may be located in the dielectric layer 11.

Figure 3:
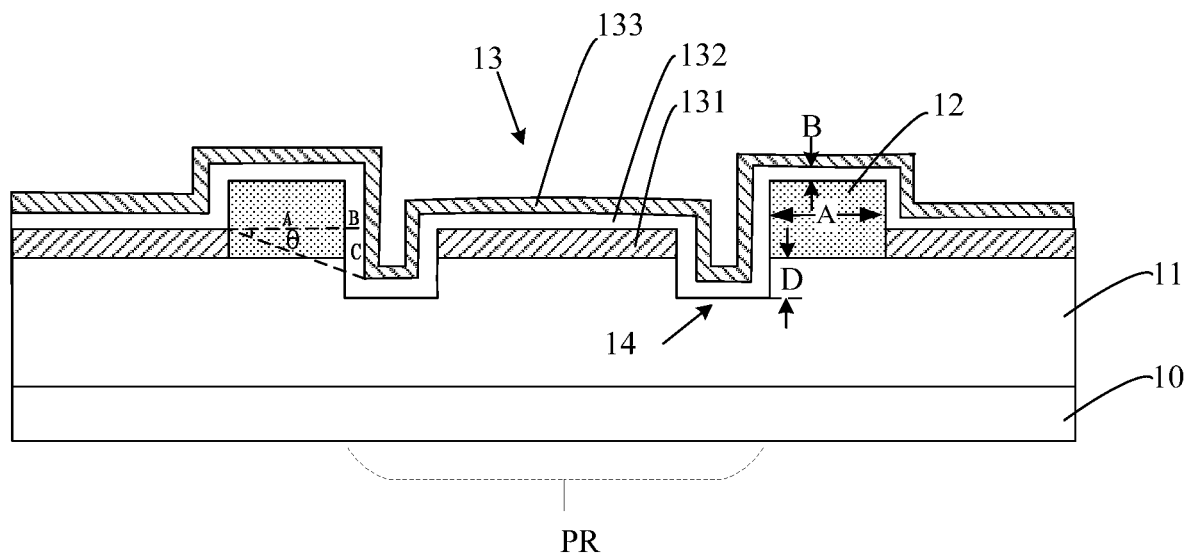
FIG. 3 is a schematic view of an array substrate according to an embodiment of the present disclosure.

As shown in FIG. 3, in an embodiment, the light emitting layer 132 and the second electrode 133 are coextensive and cover the groove 14 and the pixel defining layer 12 adjacent the groove 14. With such an arrangement, there is no additional patterning steps, thus manufacturing costs are reduced.

In this embodiment, a depth D of the groove may have the following range: $B < D \leq \sqrt{3}(A+B)$, where B is a thickness of the light emitting layer, and A is a distance between the plurality of pixel regions in a direction parallel to the surface of the base substrate. As shown in the enlarged view of the broken line portion in FIG. 3, the light leakage angle of the lateral light leaking is marked as θ. The lateral leakage is mostly concentrated in the direction where θ satisfies [0, 60°]. On the one hand, when θ exceeds an angle of about 60°, the leakage of light has little effect on adjacent pixels and can be ignored. Since $\tan \theta = C/(A+B)$ and $\theta \leq 60°$, $C \leq \sqrt{3}(A+B)$. On the other hand, if the second electrode is located in the groove to achieve the lateral light blocking function, the depth of the groove is required to be larger than the thickness B of the light emitting layer. Thereby, the depth D of the groove can be set to have the following range: $B < D \leq \sqrt{3}(A+B)$. By such a groove depth range setting, the effect of light leakage preventing can be better achieved, and the cost can be better controlled.

Figure 4:
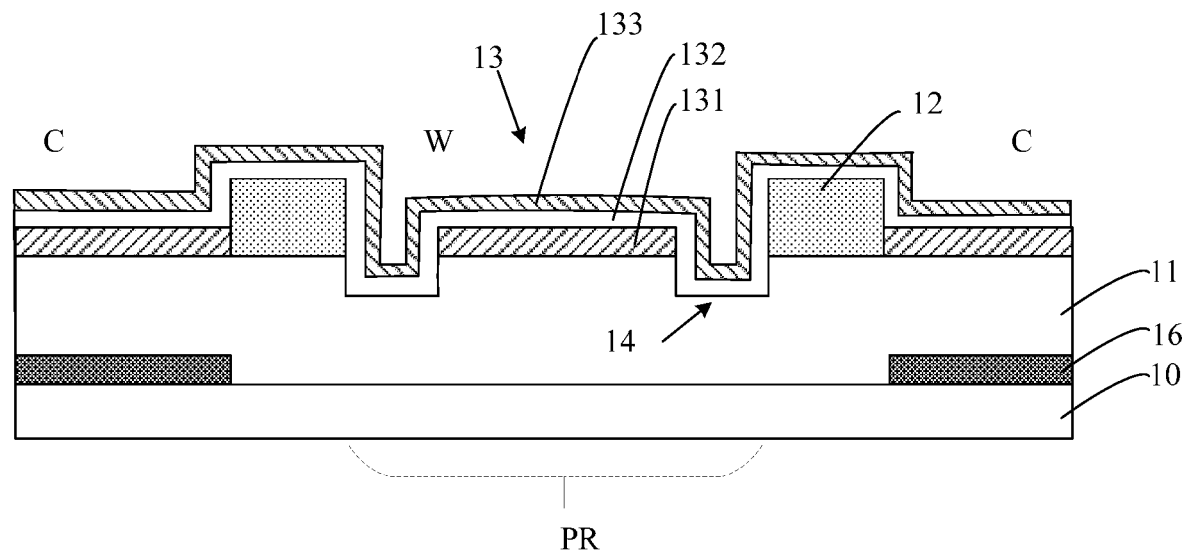
FIG. 4 is a schematic view of an array substrate according to an embodiment of the present disclosure.

FIG. 4 is a schematic view of an array substrate according to an embodiment of the present disclosure. As shown in FIG. 4, at least one pixel region provided with a light shielding portion includes a white sub-pixel region W, and the plurality of pixel regions of the array substrate further includes a color sub-pixel region C adjacent to the white sub-pixel region. Since the white light emitted from the white sub-pixel region is more sensitive to lateral light leakage, setting the light shielding portion in the white sub-pixel region can more significantly improve the display effect than in the case where the light shielding portion is disposed in the color sub-pixel region.

Further, the second electrode may include a reflective electrode. For example, the second electrode 133 may include at least one of the following materials: Mo, Al, Nb, Ti, Ag, and the first electrode 131 may include a transparent conductive oxide such as ITO, IZO. When the second electrode 133 is provided as a reflective electrode, the display device is a bottom emitting device. Compared with the top-emitting device, the fabrication process of the bottom-emitting device is relatively simple, the technology is more mature, and it is easier to mass-produce.

According to some embodiments of the present disclosure, if the light emitting layer emits white light, the color sub-pixel region may further include a color resist 16 between the base substrate 10 and the dielectric layer 11. Illustratively, the color resist layer may include a red color resist, a blue color resist, and a green color resist. The light emitted from the light emitting layer is changed to red light by the red color resist, changed to blue light by the blue color resistance, and changed to green light by the green color resistance, thereby enabling color display.

The dielectric layer may be used as a planarization layer, which may include an organic resin material. The light emitting layer may include a hole injecting layer, a hole transporting layer, a light emitting functional layer, an electron transporting layer, an electron injecting layer, and the like.

Embodiments of the present disclosure also provide a method for fabricating an array substrate.

Figure 5:
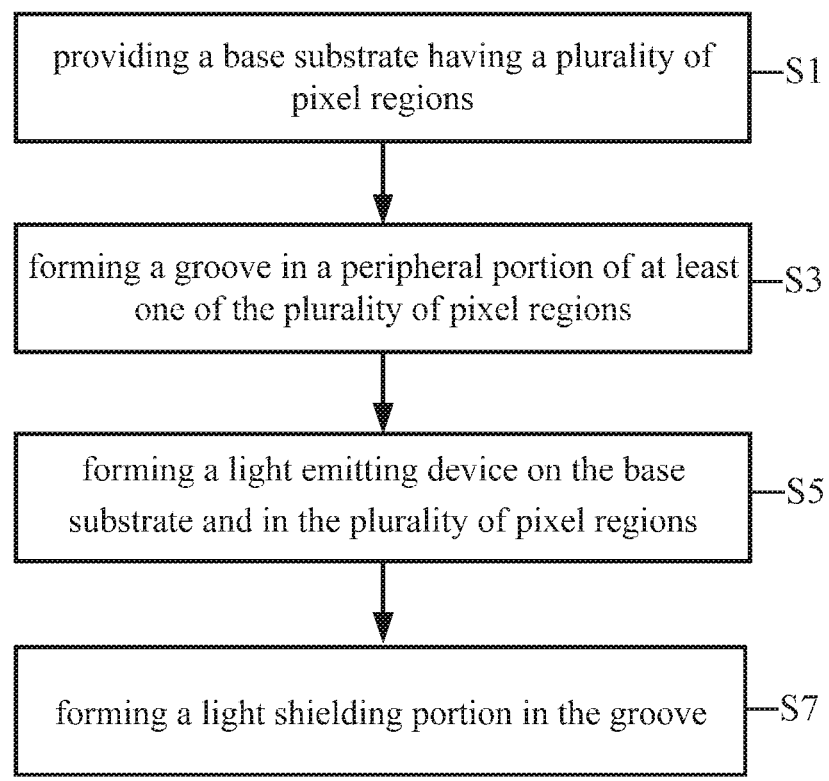
FIG. 5 is a schematic flow chart of a method for fabricating an array substrate according to an embodiment of the present disclosure.

FIG. 5 is a flow view of a method for fabricating an array substrate according to an embodiment of the present disclosure. As shown in FIG. 5, a method for fabricating an array substrate according to an embodiment of the present disclosure includes:

S1, providing a base substrate having a plurality of pixel regions;

S3, forming a groove in a peripheral portion of at least one of the plurality of pixel regions;

S5, forming a light emitting device on the base substrate and in the plurality of pixel regions, wherein a height of a bottom surface of the groove in a direction perpendicular to a surface of the base substrate is lower than a height of the light emitting layer of the light emitting device in a direction perpendicular to the surface of the base substrate; and S7, forming a light shielding portion in the groove.

In an embodiment, forming the groove includes forming a groove into the base substrate.

Figure 6A:
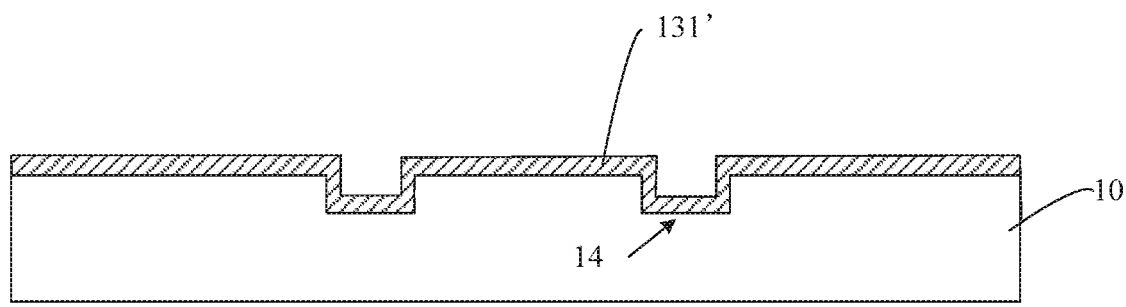
FIGS. 6A-6E are schematic flow views of a method for forming a light emitting device according to an embodiment of the present disclosure.

FIGS. 6A-6E are schematic views of a method for forming the light emitting device according to an embodiment of the present disclosure. As shown in FIGS. 6A-6E, in an embodiment, forming the light emitting device includes:

As shown in FIG. 6A, forming a first conductive layer 131' on the base substrate having a groove. The substrate may include a glass substrate.

Figure 6B:
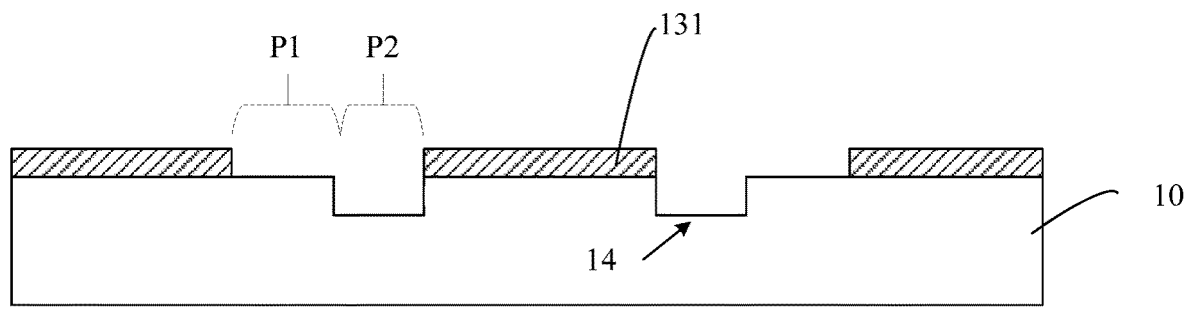

As shown in FIG. 6B, removing a portion P1 of the first conductive layer 131' between adjacent pixel regions and a portion P2 of the first conductive layer in the groove, wherein a remaining portion of the first conductive layer forms a first electrode 131 of the light emitting device.

Figure 6C:
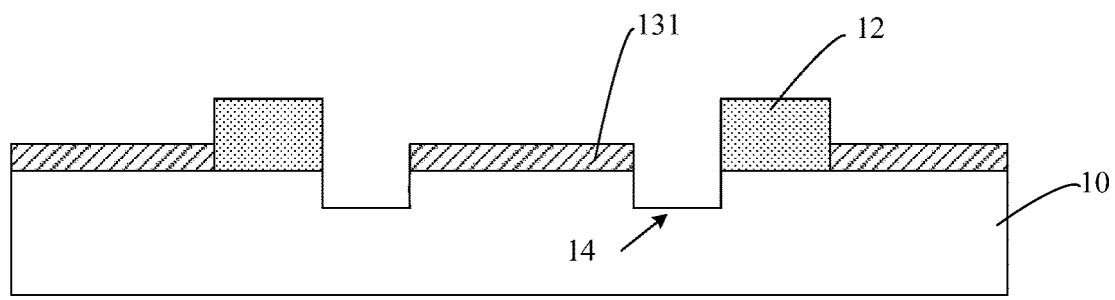

As shown in FIG. 6C, forming a pixel defining layer 12 on a portion of the base substrate between adjacent pixel regions.

Figure 6D:
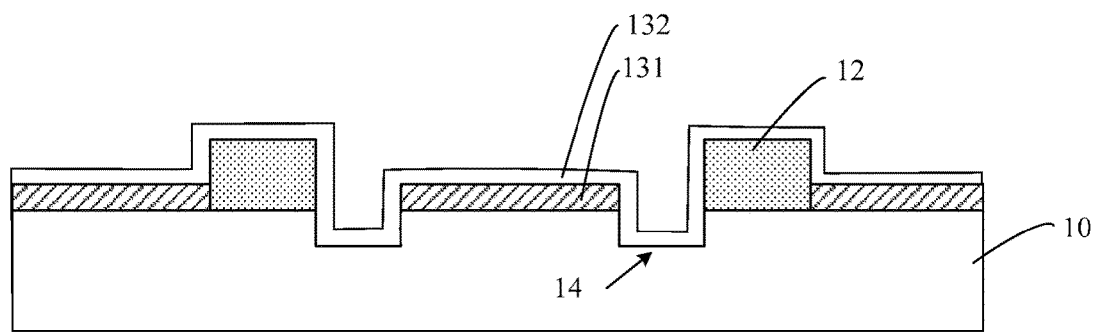

As shown in FIG. 6D, forming the light emitting layer 132 on a surface of the first electrode 131, a surface of the groove 14, and a surface of the pixel defining layer 12

Figure 6E:
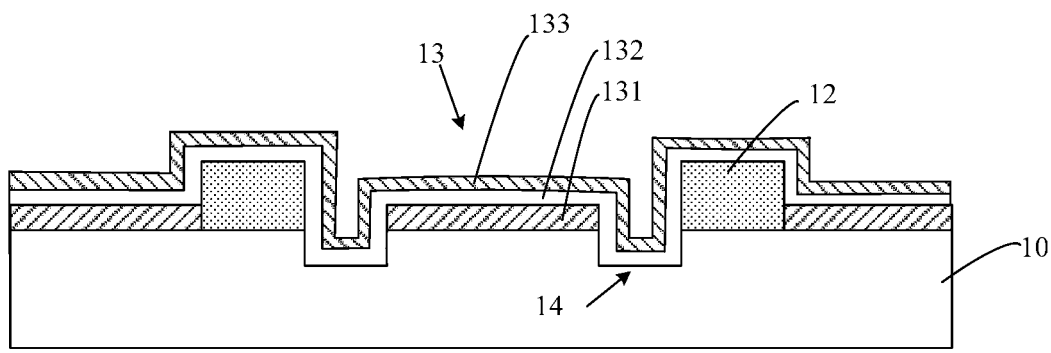

As shown in FIG. 6E, forming a second electrode 133 of the light emitting device on the light emitting layer 132, wherein a portion of the second electrode located in the groove 14 forms the light shielding portion.

Although FIGS. 6A to 6E are exemplified by providing grooves on both sides of the pixel region, it is understood that the number and position of the grooves may be set according to actual needs. For example, grooves may be provided at a plurality of pixel regions. For a pixel area, it is also possible to provide a groove only on one side thereof.

In an embodiment, forming the groove includes forming a dielectric layer on the base substrate, and forming a groove into the dielectric layer. Further, forming the light emitting device may include forming a first conductive layer on the base substrate, removing a portion of the first conductive layer between adjacent pixel regions and a portion of the first conductive layer in the groove, wherein a remaining portion of the first conductive layer forms a first electrode 131 of the light emitting device, forming a pixel defining layer 12 on a portion of the substrate between adjacent pixel regions, forming the light emitting layer on a surface of the first electrode 131, a surface of the groove 14, and a surface of the pixel defining layer 12, and forming a second electrode 133 of the light emitting device on the light emitting layer 132, wherein a portion of the second electrode located in the groove forms the light shielding portion.

Figure 7A:
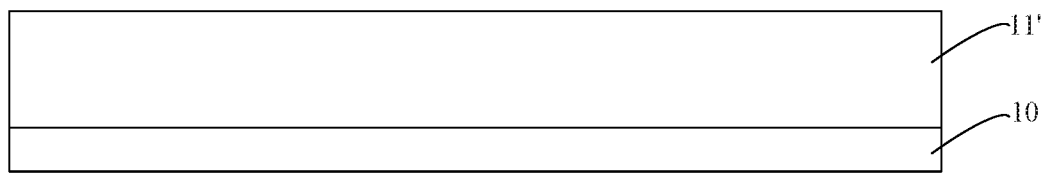
FIGS. 7A-7G are schematic flow views of a method for fabricating an array substrate according to an embodiment of the present disclosure.

FIGS. 7A-7G are flow views illustrating a method for fabricating an array substrate according to an embodiment of the present disclosure. As shown in FIGS. 7A-7G, in an embodiment, the method for fabricating the array substrate includes:

As shown in FIG. 7A, a dielectric material layer 11' is formed on the base substrate 10. For example, a coating process can be employed to form the dielectric material layer.

Figure 7B:
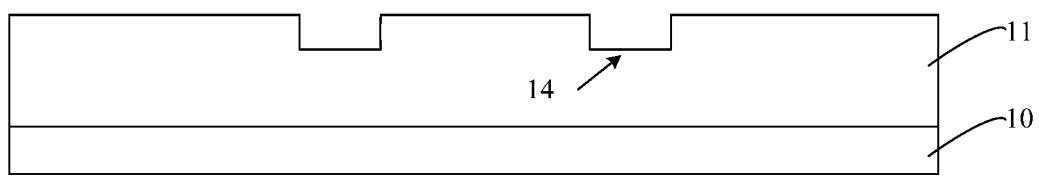

As shown in FIG. 7B, the dielectric material layer is patterned to form grooves 14, thereby forming the dielectric layer 11. The material of the dielectric material layer may include a photosensitive material, which is exposed through a half-tone process mask and then developed to form a groove. If the material of the dielectric material layer includes a non-photosensitive material, dry etching may be employed to form the groove. Compared to dry etching, the halftone process is simple and the groove depth is easier to control.

Figure 7C:
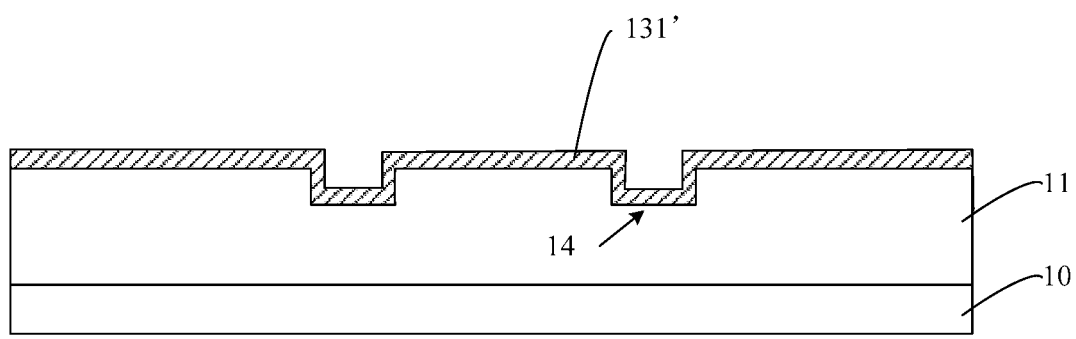

As shown in FIG. 7C, forming a first conductive layer 131' on the dielectric layer 11. For example, a transparent conductive material may be deposited to form the first conductive layer 131'.

Figure 7D:
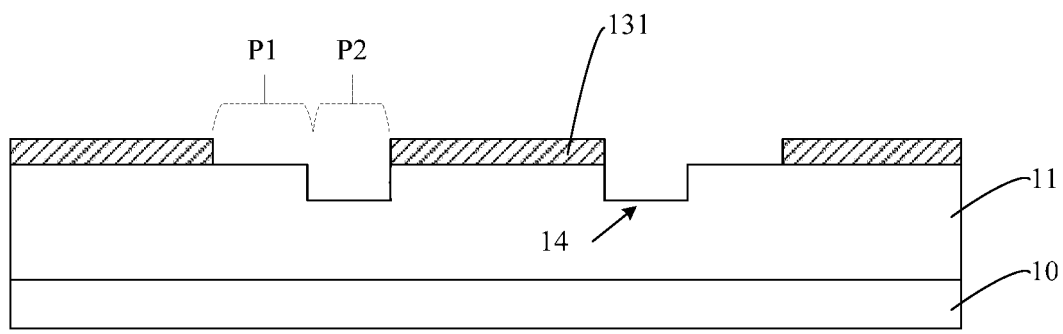

As shown in FIG. 7D, removing a portion P1 of the first conductive layer 131' between adjacent pixel regions and a portion P2 of the first conductive layer in the groove of the at least one pixel region, wherein a remaining portion of the first conductive layer forms a first electrode 131 of the light emitting device.

Figure 7E:
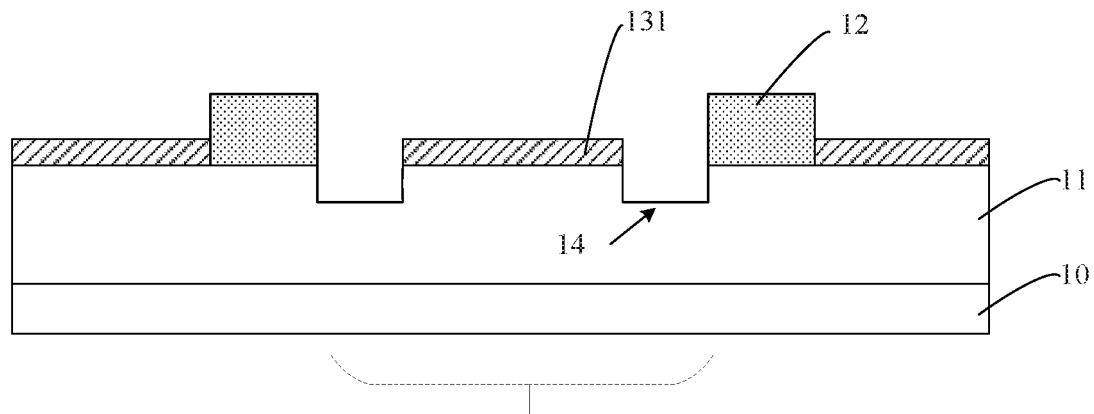

As shown in FIG. 7E, forming a pixel defining layer 12 on a portion of the dielectric layer 11 between adjacent pixel regions. According to some embodiments of the present disclosure, forming the pixel defining layer may employ a patterning process including exposure, development, and etching. The etching time of the pixel defining layer in the embodiments may be appropriately extended as compared with the forming process of the pixel defining layer of the conventional array substrate, so that the pixel defining layer in the groove can be etched away.

Figure 7F:
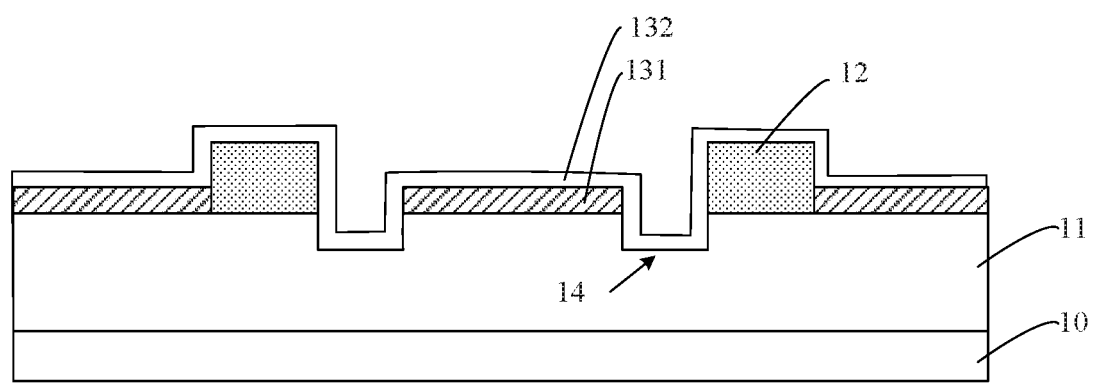

As shown in FIG. 7F, forming the light emitting layer 132 on a surface of the first electrode 131, a surface of the groove 14, and a surface of the pixel defining layer 12.

Figure 7G:
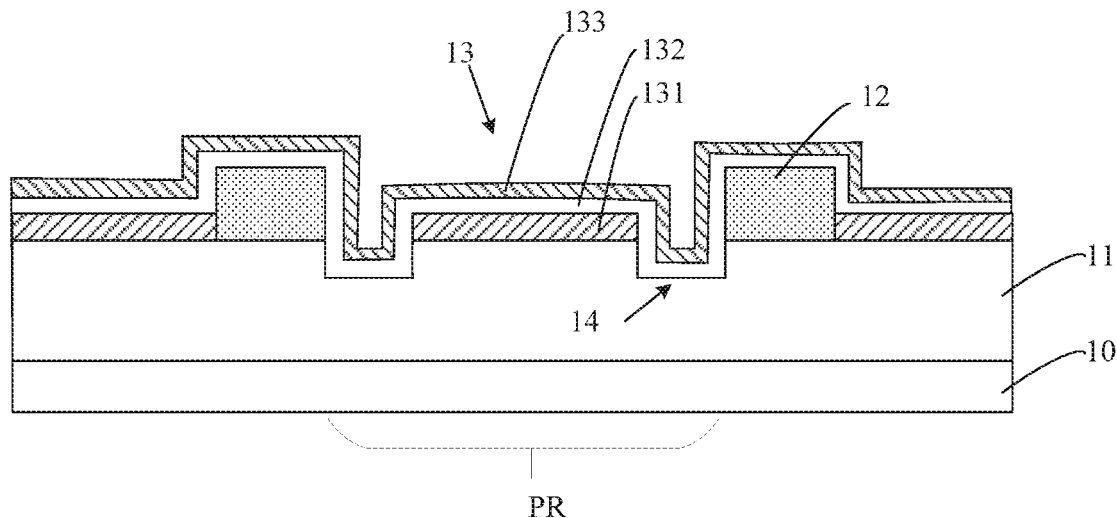

As shown in FIG. 7G, forming a second electrode 133 of the light emitting device on the light emitting layer 132, wherein a portion of the second electrode 133 located in the groove forms the light shielding portion.

Although FIGS. 7A to 7G are exemplified by providing grooves on both sides of the pixel region, it is understood that the number and position of the grooves may be set according to actual needs. For example, a groove may be provided at a plurality of pixel regions. For a pixel area, it is also possible to provide a groove only on one side thereof.

There is a light leakage problem of lateral light leakage between two adjacent pixels of the array substrate manufactured by the conventional method of manufacturing the OLED array substrate. However, the embodiments of the present disclosure can solve the problem of the lateral light leakage by providing the light shielding portion with little influence on the aperture ratio. Moreover, for the method shown in FIG. 6, the lateral light shielding is realized, the lateral light leakage between the pixels is reduced, the influence on the aperture ratio is small and the process is relatively simple.

In an embodiment, the distance D between a bottom surface of the groove and a bottom surface of the first electrode in a direction perpendicular to the surface of the base substrate is in a range of $B<D\leq\sqrt{3}(A+B)$, wherein B is the thickness of the light emitting layer, and A is a distance between the plurality of pixel regions in a direction parallel to the surface of the base substrate. By such a groove depth range setting, the effect of light leakage preventing can be better achieved, and the cost can be better controlled.

In an embodiment, at least one of the pixel regions provided with the light shielding portion includes a white sub-pixel region. This is because the white light emitted from the white sub-pixel region is more sensitive to lateral light leakage, and disposing the light shielding portion in the white sub-pixel region can more significantly improve the display effect.

Further, the second electrode may include a reflective electrode, and the plurality of pixel regions further include a color sub-pixel region adjacent to the white sub-pixel region.

Figure 8:
FIG. 8 is a schematic flow view of a method for fabricating an array substrate according to an embodiment of the present disclosure.

FIG. 8 is a schematic view of a method for fabricating an array substrate according to an embodiment of the present disclosure. As shown in FIG. 8, when the second electrode includes a reflective electrode, the method for fabricating the array substrate may further include prior to forming the dielectric layer, forming, in the color sub-pixel region, a color resist between the base substrate and the dielectric layer. In this case, the dielectric layer functions as a planarization layer.

Embodiments of the present disclosure also provide a display device including the array substrate as described above.

Figure 9:
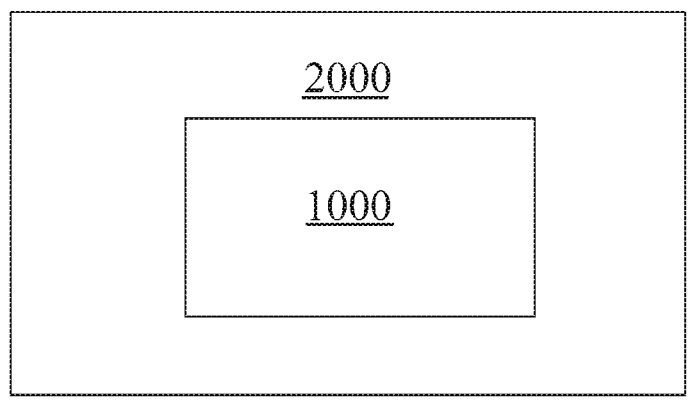
FIG. 9 is a schematic view of a display device according to an embodiment of the present disclosure.

FIG. 9 is a schematic view of a display device according to an embodiment of the present disclosure. As shown in FIG. 9, a display device 2000 according to an embodiment of the present disclosure includes an array substrate 1000. The array substrate 1000 may be an array substrate as shown in FIGS. 1A, 1B, 1C, 2, 3, and 4.

The display device provided by the embodiments of the present disclosure may be any product or component having a display function, such as a display panel, a mobile phone, a tablet computer, a television, a notebook computer, a digital photo frame, a navigator, and the like.

Having described certain specific embodiments, these embodiments have been presented by way of example only, and are not intended to limit the scope of the present disclosure. Indeed, the novel embodiments described herein may be embodied in various other forms; forms, furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An array substrate comprising:
a base substrate having a plurality of pixel regions; and
a light emitting device disposed in the plurality of pixel regions,
wherein at least one of the plurality of pixel regions has a groove at a peripheral portion thereof and a light shielding portion located in the groove, wherein a height of a bottom surface of the groove in a direction perpendicular to a surface of the base substrate is lower than a height of a light emitting layer of the light emitting device in the direction perpendicular to the surface of the base substrate, wherein the light emitting device comprises a first electrode, the light emitting layer, and a second electrode sequentially disposed from bottom to top, and wherein the light emitting layer extends into the groove and covers an upper surface of the groove.

2. The array substrate according to claim 1, wherein the second electrode has an extension portion extending into the groove, and wherein the extension portion of the second electrode functions as the light shielding portion.

3. The array substrate according to claim 2, wherein the light emitting layer and the second electrode are coextensive and cover the groove.

4. The array substrate according to claim 3, wherein a distance D between a bottom surface of the groove and a bottom surface of the first electrode in a direction perpendicular to the surface of the base substrate is in a range of B<D≤√3(A+B), wherein B is a thickness of the light emitting layer, and wherein A is a distance between the plurality of pixel regions in a direction parallel to the surface of the base substrate.

5. The array substrate according to claim 1, wherein the groove is disposed in the base substrate.

6. The array substrate according to claim 1, wherein the array substrate further comprises a dielectric layer between the light emitting device and the base substrate, and wherein the groove is disposed in the dielectric layer.

7. The array substrate according to claim 3, wherein the array substrate further comprises a pixel defining layer between adjacent pixel regions, and wherein the light emitting layer and the second electrode further cover the pixel defining layer.

8. The array substrate according to claim 1, wherein the at least one pixel region comprises a white sub-pixel region, and wherein the plurality of pixel regions further comprises a color sub-pixel region adjacent to the white sub-pixel region.

9. The array substrate according to claim 8, wherein the second electrode includes a reflective electrode.

10. The array substrate according to claim 9, wherein the light emitting layer is capable of emitting white light, and wherein the color sub-pixel region further comprises a color resist disposed between the base substrate and a dielectric layer.

11. A display device comprising the array substrate according to claim 1.

12. The array substrate according to claim 2, wherein the groove is disposed in the base substrate.

13. The array substrate according to claim 3, wherein the groove is disposed in the base substrate.

14. A method for fabricating an array substrate, the method comprising:
   providing a base substrate having a plurality of pixel regions;
   forming a groove in a peripheral portion of at least one of the plurality of pixel regions;
   forming a light emitting device on the base substrate and in the plurality of pixel regions, wherein a height of a bottom surface of the groove in a direction perpendicular to a surface of the base substrate is lower than a height of a light emitting layer of the light emitting device in the direction perpendicular to the surface of the base substrate; and
   forming a light shielding portion in the groove, wherein the light emitting device comprises a first electrode, the light emitting layer, and a second electrode sequentially disposed from bottom to top, and wherein the light emitting layer extends into the groove and covers an upper surface of the groove.

15. The method for fabricating an array substrate according to claim 14, wherein forming the groove comprises forming the groove into the base substrate.

16. The method for fabricating an array substrate according to claim 15, wherein forming the light emitting device comprises:
   forming a first conductive layer on the base substrate;
   removing a portion of the first conductive layer between adjacent pixel regions and a portion of the first conductive layer in the groove of the at least one pixel region, wherein a remaining portion of the first conductive layer forms the first electrode of the light emitting device;
   forming a pixel defining layer on a portion of the base substrate between the adjacent pixel regions;
   forming the light emitting layer on a surface of the first electrode, a surface of the groove, and a surface of the pixel defining layer; and
   forming the second electrode of the light emitting device on the light emitting layer, wherein a portion of the second electrode located in the groove forms the light shielding portion.

17. The method for fabricating an array substrate according to claim 14, wherein forming the groove comprises forming a dielectric layer on the base substrate, and forming the groove into the dielectric layer.

18. The method for fabricating an array substrate according to claim 17, wherein forming the light emitting device comprises:
   forming a first conductive layer on the dielectric layer;
   removing a portion of the first conductive layer between adjacent pixel regions and a portion of the first conductive layer in the groove of the at least one pixel region, wherein a remaining portion of the first conductive layer forms the first electrode of the light emitting device;
   forming a pixel defining layer on a portion of the dielectric layer between the adjacent pixel regions;
   forming the light emitting layer on a surface of the first electrode, a surface of the groove, and a surface of the pixel defining layer; and
   forming the second electrode of the light emitting device on the light emitting layer, wherein a portion of the second electrode located in the groove forms the light shielding portion.

19. The method for fabricating an array substrate according to claim 17, wherein the second electrode includes a reflective electrode, wherein the plurality of pixel regions further comprise a color sub-pixel region adjacent to a white sub-pixel region, and wherein the method also comprises, prior to forming the dielectric layer,
   forming, in the color sub-pixel region, a color resist between the base substrate and the dielectric layer, wherein the dielectric layer functions as a planarization layer.

20. The method for fabricating an array substrate according to claim 18, wherein the second electrode includes a reflective electrode, wherein the plurality of pixel regions further comprise a color sub-pixel region adjacent to a white sub-pixel region, and wherein the method also comprises, prior to forming the dielectric layer,
   forming, in the color sub-pixel region, a color resist between the base substrate and the dielectric layer, wherein the dielectric layer functions as a planarization layer.

* * * * *